(12) United States Patent
Patra

(10) Patent No.: US 9,841,683 B2
(45) Date of Patent: Dec. 12, 2017

(54) ILLUMINATION OPTICAL UNIT FOR EUV PROJECTION LITHOGRAPHY

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/066,124

(22) Filed: Mar. 10, 2016

(65) Prior Publication Data

US 2016/0187786 A1 Jun. 30, 2016

Related U.S. Application Data

(63) Continuation of application No. PCT/EP2014/067960, filed on Aug. 25, 2014.

(30) Foreign Application Priority Data

Sep. 11, 2013 (DE) .................. 10 2013 218 130

(51) Int. Cl.
*G03F 7/20* (2006.01)
*G02B 26/08* (2006.01)
(Continued)

(52) U.S. Cl.
CPC .......... *G03F 7/702* (2013.01); *G02B 5/0891* (2013.01); *G02B 5/09* (2013.01); *G02B 19/0023* (2013.01);
(Continued)

(58) Field of Classification Search
None
See application file for complete search history.

(56) References Cited

U.S. PATENT DOCUMENTS 6,014,252 A * 1/2000 Shafer ................ G02B 17/0657
359/208.1
6,400,794 B1 6/2002 Schultz et al.
(Continued)

FOREIGN PATENT DOCUMENTS

DE 10 2006 017 336 A1 10/2007
DE 10 2008 009 600 A1 8/2009
(Continued)

OTHER PUBLICATIONS

International Search Report for corresponding PCT Appl No. PCT/EP2014/067960, dated Nov. 27, 2014.
(Continued)

*Primary Examiner* — Steven H Whitesell Gordon
(74) *Attorney, Agent, or Firm* — Fish & Richardson P.C.

(57) ABSTRACT

An illumination optical unit for EUV projection lithography illuminates an illumination field with illumination light from a light source. A first facet mirror of the illumination optical unit has a plurality of first facets for the reflective guidance of partial beams of a beam of the EUV illumination light. Disposed downstream of the first facet mirror is a second facet mirror with a plurality of second facets for further reflective guidance of the partial beams. As a result of this, the reflective beam guidance that the two facets predetermines object field illumination channels, by which the whole object field is illuminable by the illumination light in each case and to which exactly one first facet and exactly one second facet is assigned in each case.

20 Claims, 5 Drawing Sheets

(51) Int. Cl.
  *G02B 5/08*  (2006.01)
  *G02B 5/09*  (2006.01)
  *G02B 19/00* (2006.01)

(52) U.S. Cl.
  CPC ..... *G02B 19/0095* (2013.01); *G02B 26/0833* (2013.01); *G03F 7/70075* (2013.01); *G03F 7/70116* (2013.01)

(56) References Cited

U.S. PATENT DOCUMENTS

| | | |
|---|---|---|
| 6,507,440 B1 | 1/2003 | Schultz |
| 2005/0088760 A1 | 4/2005 | Mann et al. |
| 2007/0236784 A1* | 10/2007 | Singer .................. G02B 21/06 359/380 |
| 2011/0001947 A1 | 1/2011 | Dinger et al. |

FOREIGN PATENT DOCUMENTS

| | | |
|---|---|---|
| DE | 10 2012 210 073 A1 | 4/2013 |
| DE | 10 2012 207 511 A1 | 5/2013 |
| EP | 0 955 641 A1 | 11/1999 |
| EP | 1 814 147 A1 | 8/2007 |

OTHER PUBLICATIONS

German Office Action, with translation thereof, for corresponding DE Appl No. 10 2013 218 130.2, dated May 13, 2014.

\* cited by examiner

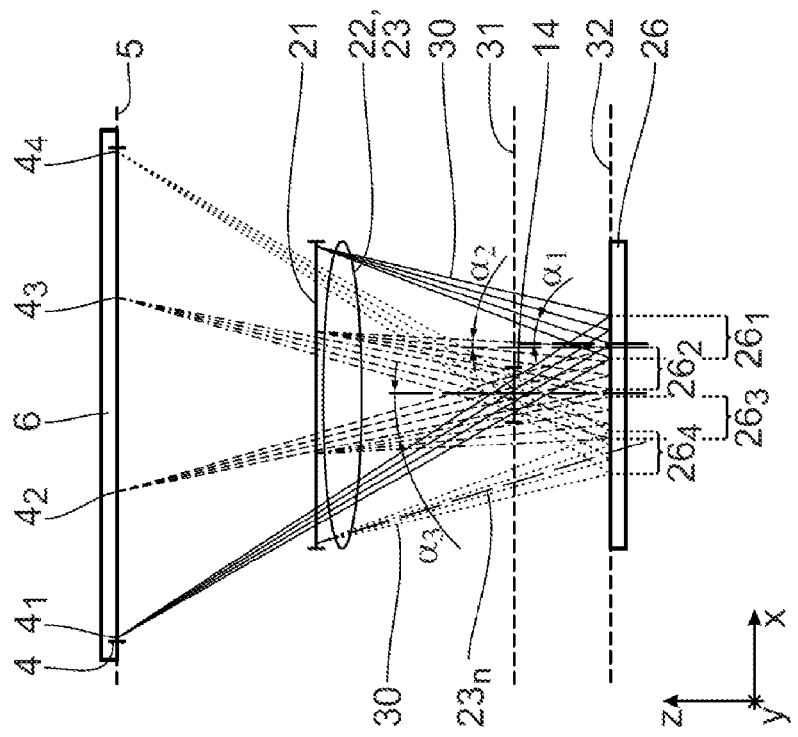
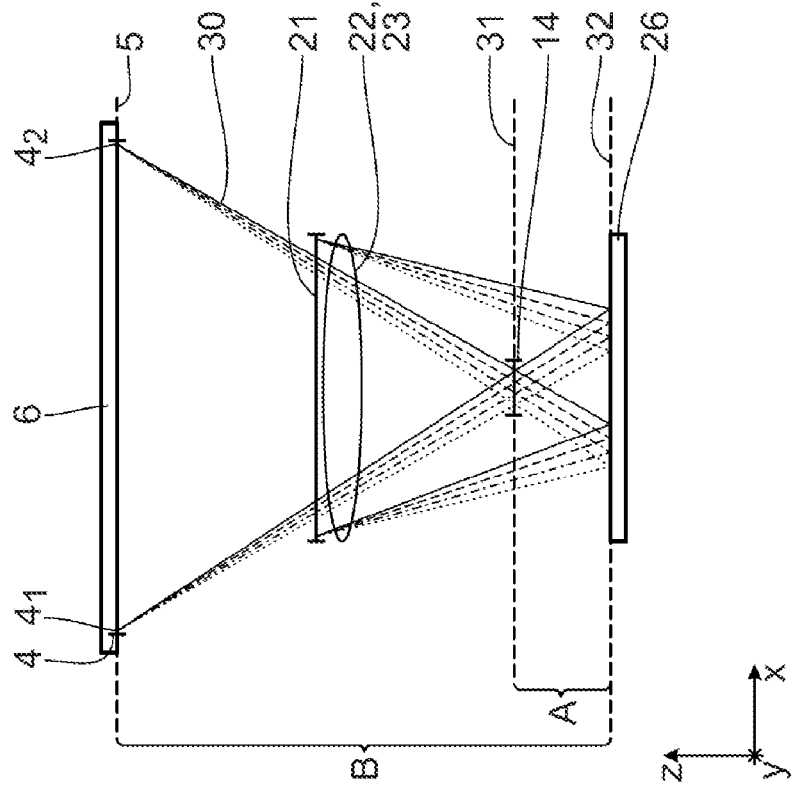

ILLUMINATION OPTICAL UNIT FOR EUV PROJECTION LITHOGRAPHY

CROSS-REFERENCE TO RELATED APPLICATIONS

The present application is a continuation of, and claims benefit under 35 USC 120 to, international application PCT/EP2014/067960 filed Aug. 25, 2014, which claims benefit under 35 USC 119 of German Application No. 10 2013 218 130.2, filed Sep. 11, 2013. The entire disclosure of international application PCT/EP2014/067960 is incorporated by reference herein.

FIELD

The disclosure relates to an illumination optical unit for EUV projection lithography. Furthermore, the disclosure relates to a facet mirror as part of such an illumination optical unit, an optical system with such an illumination optical unit, an illumination system with such an illumination optical unit, a projection exposure apparatus with such an illumination system, a production method for a microstructured or nanostructured component using such a projection exposure apparatus and a component produced by such a method.

BACKGROUND

Illumination optical units for EUV projection lithography are known from U.S. Pat. No. 6,507,440, EP 0 955 641 A1 and DE 10 2008 009 600 A. A further illumination optical unit is known from DE 10 2012 210 073 A1.

SUMMARY

The disclosure seeks to provide an illumination optical unit of the aforementioned type in such a way that reflection losses at the second facets are minimized.

In one aspect, the disclosure provides an illumination optical unit for EUV projection lithography for illuminating an illumination field in which an object field of a downstream imaging optical unit is arranged, in which object field in turn an object displaceable in an object displacement direction is arrangeable, with illumination light from a light source.

The illumination optical unit includes: a first facet mirror including a plurality of first facets for the reflective guidance of partial beams of a beam of the EUV illumination light; and a second facet mirror, disposed downstream of the first facet mirror, with a plurality of second facets for reflective guidance of the partial beams reflected by the first facets such that object field illumination channels are predetermined by the first facets and the second facets assigned by way of the reflective beam guidance, by which object field illumination channels the whole object field is illuminable by the illumination light in each case and to which object field illumination channels exactly one first and exactly one second facet is assigned in each case. The first facet mirror is part of an imaging optical unit which generates one of the plurality of images of the light source corresponding to the number of object field illumination channels. The first facets are imaged into the object field in a manner being superimposed on one another via the second facets. The illumination optical unit is configured in such a way that the second facets are arranged at a distance from the images of the light source along the object field illumination channels. All images of the light source lie upstream of the second facets in the beam path of the object field illumination channels or all images of the light source lie downstream of the second facets in the beam path of the object field illumination channels.

What was identified according to the disclosure is that, compared to the prior art, a spacing of the second facets from the light source images leads to a reduction in an angular bandwidth of angles of incidence of the illumination light on respective spatial regions on the second facets. A spacing of the second facets from the images of the light source means that the light source images are not created adjacent to the pupil facets. A distance of the images of the light source from the second facets along the object field illumination channels can lie in the region of 50 mm. A different distance in the range between 20 mm and 80 mm, in particular in the range between 30 mm and 70 mm or in the range between 40 mm and 60 mm, is also possible. The images of the light source can all lie in one and the same image plane, which coincides with a pupil plane of the illumination optical unit.

The first facet mirror is arranged in a field plane of the illumination optical unit conjugate to the object field. In accordance with the spacing of the second facets from the light source images, the second facet mirror is not arranged in a pupil plane, but rather at a distance therefrom.

An angular bandwidth of an angle of incidence of the illumination light partial beam on the respective second facet can be less than 5°. Such an angular bandwidth equals half an overall angular bandwidth of angles of incidence of the illumination light partial beam on the second facet. The angular bandwidth can be less than 2°. Hence, the angular bandwidth is measured proceeding from a centroid or central ray in the respective illumination partial beam.

The second facets can carry a highly reflective coating for the illumination light. Such a highly reflective coating minimizes reflection losses at the second facets. The highly reflective coating can be a multi-ply coating. The multi-ply coating in turn can have a multiplicity of bi-plies such that an alternate layer sequence made of two layer materials, e.g. molybdenum and silicon, emerges. Several tens of such bi-plies can build up the multiply coating.

The highly reflective coating on at least one of the second facets can be match: in a first spatial region on the second facet to the maximum reflection of the illumination light which is incident on the second facet under a first angle of incidence; and in a second spatial region on the second facet to the maximum reflection of the illumination light which is incident on the second facet under a second angle of incidence, wherein the first spatial region and the second spatial region do not overlap, and the first angle of incidence differs from the second angle of incidence. Such a highly reflective coating can be matched to the respective angles of incidence incident on different spatial regions of the second facet, which further reduces reflection losses at the pupil facets.

The images of the light source can lie in the illumination light beam path between the second facet mirror and the object field, or the images of the light source can lie in the illumination light beam path between the first facet mirror and the second facet mirror. Such refinements of the illumination optical unit were found to be suitable depending on the structural conditions and depending on the desired properties of the projection optical unit.

In one aspect, the disclosure provides a facet mirror as part of the illumination optical unit for EUV projection lithography for illuminating an illumination field in which an object field is arrangeable in a downstream imaging optical unit with illumination light from a light source, wherein the facet mirror includes a plurality of facets for reflective guidance of partial beams of a beam of EUV illumination light with a wavelength which is 10 nm at most. The facets reflect the respective illumination light partial beam with a reflection of greater than 30%. Such a facet mirror leads to particularly low losses of the particularly short wavelength EUV illumination light. The reflectivity of the facets can be greater than 40%, can be greater than 50%, can be greater than 60% and can also be even greater.

An optical system can include an illumination optical unit described herein, wherein an object to be imaged is arrangeable in the object field, and a projection optical unit for imaging the object field into an image field in which a substrate is arrangeable. The advantages of such an optical system correspond to those which have already been explained above with reference to the illumination optical unit according to the disclosure. The illumination optical unit can have a facet mirror as described herein.

A pupil plane of the projection optical unit can coincide with a plane of the images of the light source generated by the imaging optical unit of the illumination optical unit. Such an arrangement of the entry pupil of the projection optical unit leads to a particularly effective guidance of the illumination and imaging light.

An illumination system can include an illumination optical unit as described herein with a light source for generating the illumination light. A projection exposure apparatus can include a light source for generating illumination light and an optical system as described herein. A method can include using such a projection exposure apparatus for producing a microstructured or nanostructured component. The advantages of such an illumination system, such a projection exposure apparatus, such a production method, and such a component correspond to those which were already explained above with reference to the illumination optical unit according to the disclosure, the facet mirror according to the disclosure and the optical system according to the disclosure. The light source can be an EUV light source. The EUV light source can generate light in the wavelength range between 5 nm and 30 nm. The EUV light source can generate light in the wavelength range shorter than 10 nm. The EUV light source can be a free electron laser (FEL), in particular. The produced component can be a semiconductor component in particular, for example a semiconductor chip, in particular a memory chip.

BRIEF DESCRIPTION OF THE DRAWINGS

Exemplary embodiments of the disclosure are explained in greater detail below with reference to the drawings, in which:

FIG. 5 shows, in an illustration similar to FIG. 3, a beam path according to the disclosure between a field facet of a field facet mirror and an object field in the illumination optical unit according to the disclosure, with an entry pupil in the beam path between a pupil facet of a pupil facet mirror and the object field;

FIG. 6 shows, in an illustration similar to FIG. 4, the beam path in the illumination optical unit according to the disclosure according to FIG. 5;

DETAILED DESCRIPTION

Figure 1:
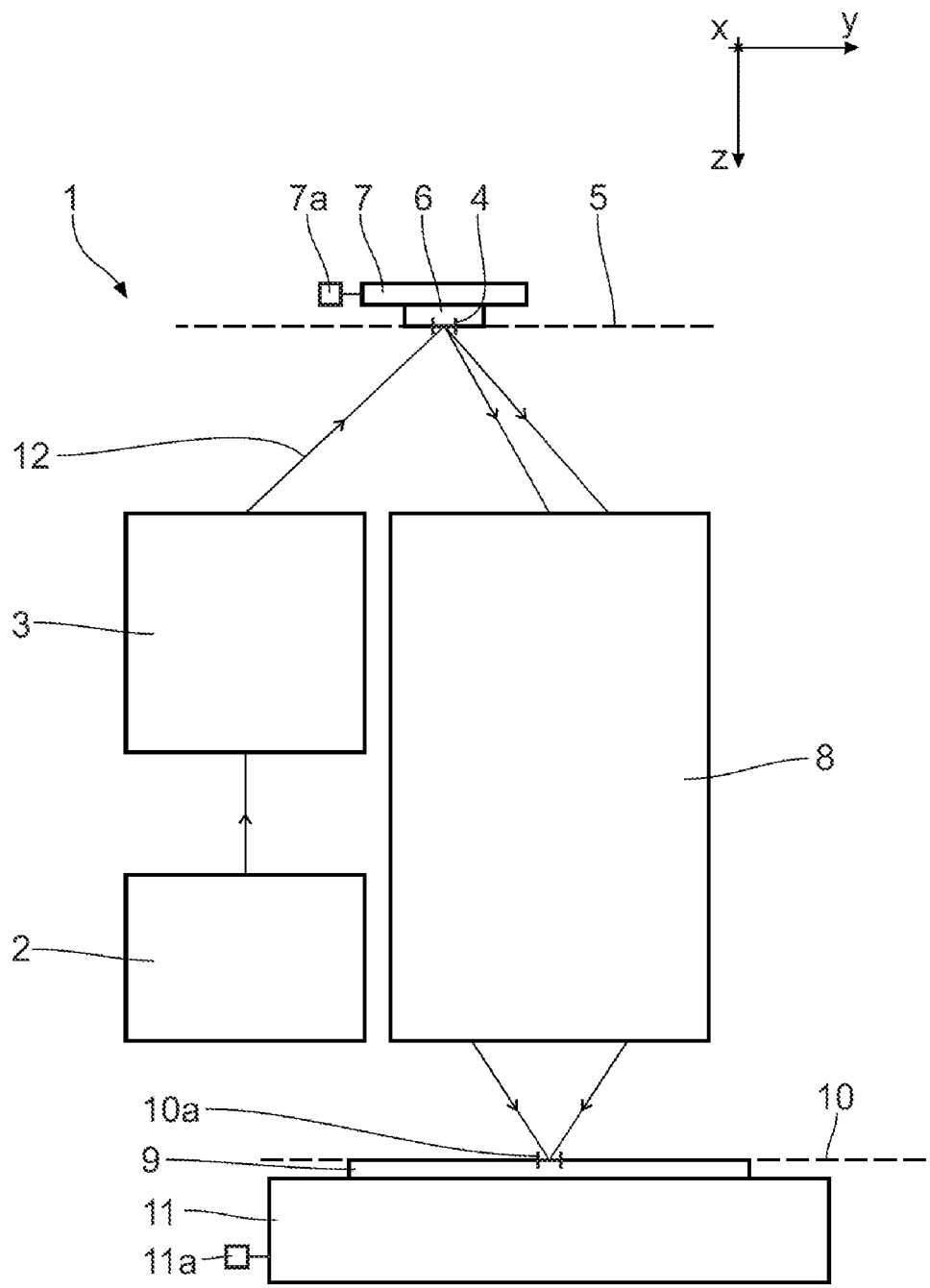
FIG. 1 schematically shows a projection exposure apparatus for the EUV projection lithography with a primary light source, an illumination optical unit and a projection optical unit.

FIG. 1 shows a schematic illustration of a projection lithography projection exposure apparatus 1. The projection exposure apparatus 1 includes, inter alia, a light-source unit 2 and an illumination optical unit 3 for illuminating an object field 4 in an object plane 5, in which a structure-bearing mask 6, which is also referred to as reticle, is arranged. The reticle 6 is held by a reticle holder 7.

In order to simplify the description of positional relationships, FIG. 1 plots a Cartesian xyz-coordinate system as a global coordinate system of the projection exposure apparatus 1. The x-axis extends perpendicular to the plane of the drawing of FIG. 1 and into the latter. The y-axis extends to the right. The z-axis extends downward.

The reticle 6 is displaceable in the object plane 5 in the y-direction with the aid of the reticle holder 7 having an object displacement device 7a.

A further component of the projection exposure apparatus 1 is a projection lens 8 for imaging the structure-bearing mask 6 on a substrate 9, the so-called wafer. This substrate 9 contains a photosensitive layer which is chemically modified under exposure. This is referred to as a lithographic step. Here, the structure-bearing mask 6 is arranged in the object plane 5 and the substrate 9 is arranged in an image plane 10 of the projection lens 8. During the exposure, the wafer 9 is likewise displaced along the y-direction via a wafer holder 11 having a wafer displacement apparatus 11a, to be precise in a synchronous fashion with the displacement of the substrate holder 7. During the exposure, the object field 4 is imaged in an image field 10a in the image plane 10. A beam path of illumination and imaging light 12 between the light-source unit 2 and the wafer 9 is indicated very schematically in FIG. 1.

The illumination optical unit 3 and the projection lens 8 include a plurality of optical elements. Here, these optical elements can be designed in both a refractive and reflective fashion. Combinations of refractive and reflective optical elements within the illumination optical unit 3 or the projection lens 8 are also possible. The structure-bearing mask 6 can equally have a reflective or transmissive design. Such projection exposure apparatuses consist completely of reflective components in particular when they are operated with radiation with a wavelength of <193 nm or <157 nm, in particular with a wavelength in the extreme ultraviolet range (EUV) of 5 to 15 nm. Projection exposure apparatuses 1 are often operated as so-called scanners. This means that the structure-bearing mask 6 is moved through a slit-shaped illumination field, which coincides with the object field 4, along the scanning direction y, while the substrate 9 is moved synchronously therewith in the image plane 10 of the projection lens 8. The ratio of the speeds of structure-bearing mask 6 and substrate 9 in this case corresponds to the magnification of the projection lens 8, which is usually less than 1, for example equal to ¼.

Figure 2:
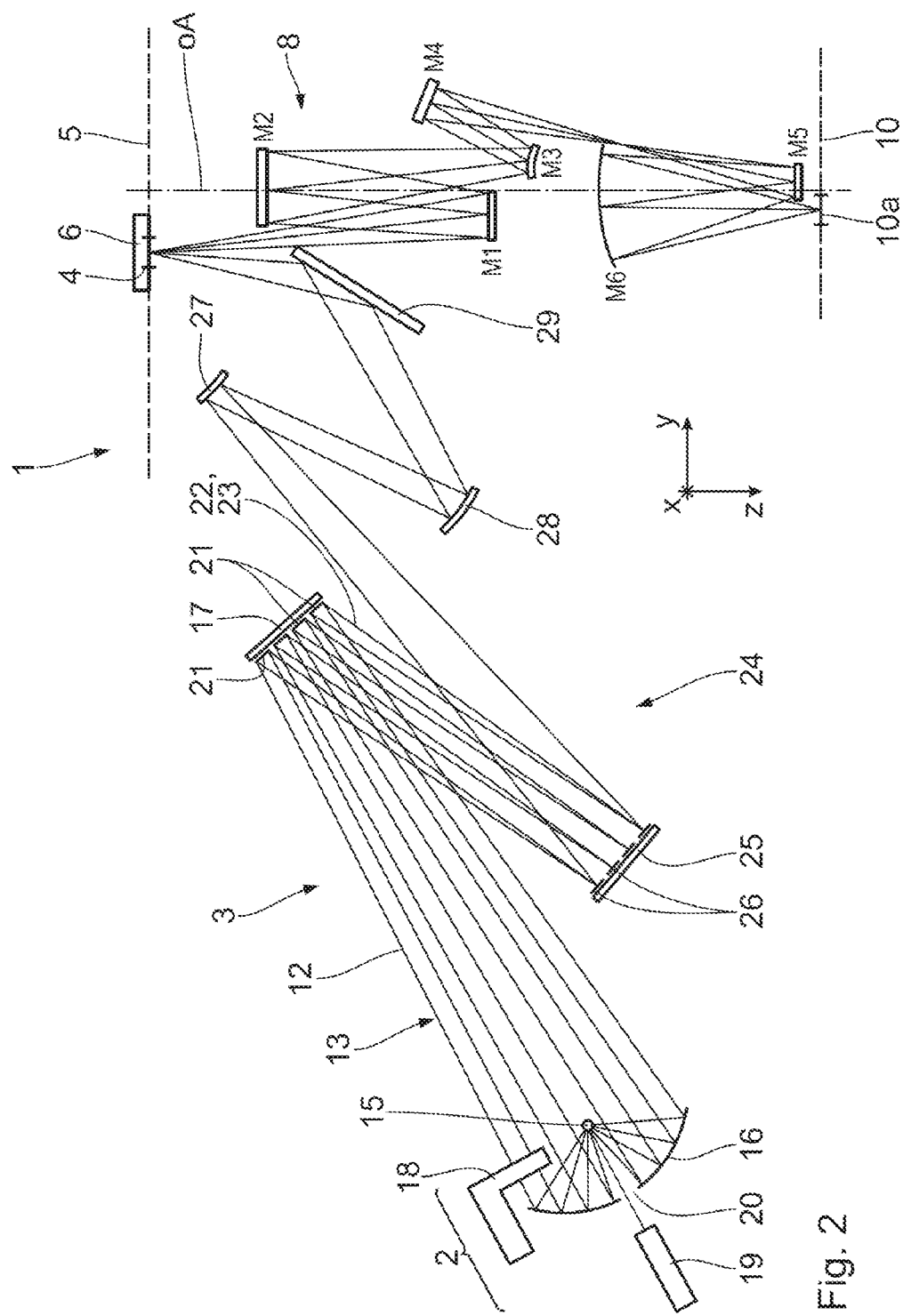
FIG. 2 schematically shows a meridional section through the projection exposure apparatus according to FIG. 1, wherein a beam path for some partial beams of illumination and imaging light is highlighted in detail.

FIG. 2 shows an embodiment of the projection exposure apparatus 1 with the illumination optical unit 3 and the projection lens 8 in more detail. Here, the illumination optical unit 3 includes a first transfer partial optical unit 13 in the form of an imaging optical unit for generating secondary light sources 14 by imaging a primary light source in the form of a source plasma 15 of the light-source unit 2. The first transfer partial optical unit 13 includes an integral or multipart collector mirror 16, which collects the EUV radiation of the source plasma in the wavelength range between 5 nm and 15 nm, and a first facet mirror in the form of a field facet mirror 17.

The light-source unit 2 can be configured in various embodiments. A laser plasma source (LPP) is illustrated. In this source type, the tightly restricted source plasma 15 is generated by virtue of a small material droplet being produced by a droplet generator 18 and being moved to a predetermined location. There, the material droplet is irradiated by a high-energy laser 19 such that the material converts into a plasma state and emits radiation in the wavelength range 5 to 15 nm. Here, the laser 19 is arranged in such a way that the laser radiation passes through an opening 20 in the collector mirror 16 before it impinges on the material droplet. By way of example, an infrared laser, in particular a $CO_2$ laser, with a wavelength of 10 µm is used as a laser 19. Alternatively, the light-source unit 2 can also be designed as a discharge source, in which the source plasma 15 is created with the aid of a discharge. A further variant for an EUV light-source unit 2 is a free electron laser (FEL).

The first facet mirror 17 has field facets 21, which provide object field illumination channels 22 for reflective guidance of partial beams 23 of the illumination light 12 to the illumination field 4. The whole object field 4 is illuminable with the illumination light 12 in each case by way of the object field illumination channels 22 respectively reflected by the field facets 21. The field facet mirror 17 is part of the transfer partial optical unit 13, which generates a plurality of secondary light sources 14, i.e. a plurality of images of the light source, corresponding to the number of the object field illumination channels 22 and hence the number of field facets 21.

The illumination optical unit 3 includes a further transfer partial optical unit 24 for the superimposed imaging of the field facets 21 into the object or illumination field 4. The second transfer partial optical unit 24 has a second facet mirror 25 in the form of a pupil facet mirror, which is arranged downstream of the first facet mirror 17 in the beam path of the illumination light 12. The pupil facet mirror 25 has a plurality of pupil facets 26, which are also referred to as second facets.

The illumination light 12 impinges on the field facet mirror 17 with a convergent beam path. A first telescopic mirror 27 and a second telescopic mirror 28 are arranged in the light path downstream of the pupil facet mirror 25, with both telescopic mirrors being operated in the region of a perpendicular incidence, i.e. the illumination light 12 impinges on the two mirrors 27, 28 with an angle of incidence of between 0° and 45°. Here, the angle of incidence is understood to mean the angle between the incident radiation and the normal of the reflective optical surface. Arranged downstream of this in the beam path is a deflection mirror 29, which guides the radiation incident thereon onto the object field 4 in the object plane 5. The deflection mirror 29 is operated under grazing incidence, i.e. the illumination light 12 impinges on the mirror at an angle of incidence of between 45° and 90°. The reflective structure-bearing mask 6, which is imaged in the image field 10a in the image plane 10 with the aid of the projection lens 8, is arranged at the location of the object field 4. The projection lens 8 includes six mirrors M1, M2, M3, M4, M5 and M6, which are numbered in the sequence of the beam path of the imaging light 3. All six mirrors M1 to M6 of the projection lens 8 respectively have a reflective optical surface, which extends along a surface rotationally symmetric about the optical axis oA. A non-rotationally symmetric surface design of the mirrors M1 to M6, for example a free-form surface design of at least one mirror or of all mirrors M1 to M6, is also possible.

In order to explain the disclosure, a beam path, known from the prior art, of the illumination light partial beam 23 of a corresponding object field illumination channel 22 is subsequently explained schematically between precisely one of the field facets 21 and the reticle 6 in the object field 4 using FIGS. 3 and 4.

Figure 3:
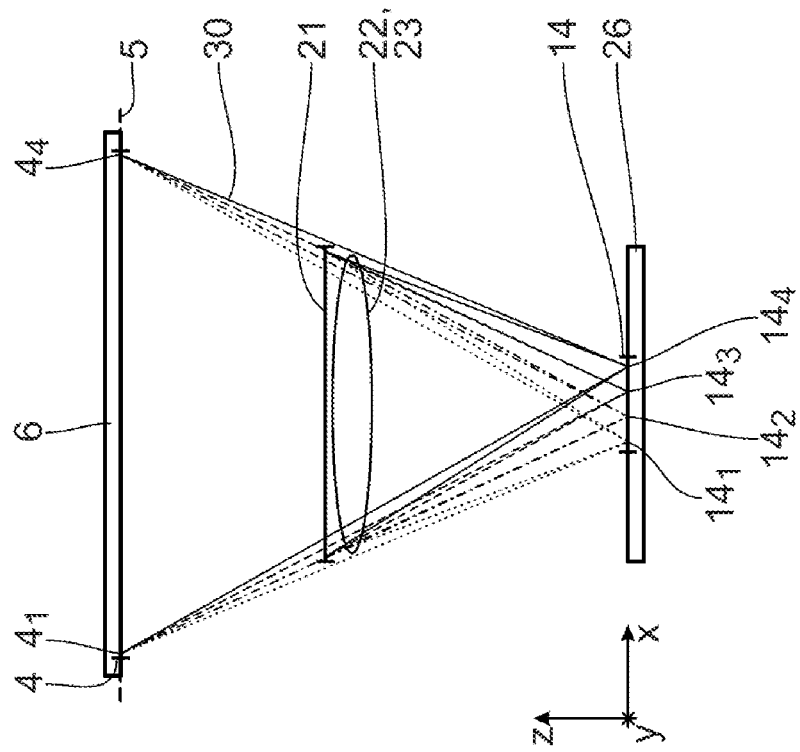
FIG. 3 schematically shows a top view of a beam path between a field facet of a field facet mirror of the projection exposure apparatus and an object field of the projection exposure apparatus, wherein a transfer optical unit between a pupil facet of a pupil facet mirror of the projection exposure apparatus and the object field has been omitted and wherein beam paths of in each case four individual rays are depicted, which belong to two object field points, at most spaced apart from one another along a long object field dimension x, wherein this is a beam path from the prior art.

FIG. 3 and the following likewise plot a coordinate system, which is a local xyz-coordinate system. An x-direction of this respective local coordinate system in each case extends parallel to the x-direction of the global xyz-coordinate system according to FIGS. 1 and 2, which relates to the whole projection exposure apparatus 1. A z-direction of the respective local coordinate system extends along a chief ray direction of the illumination light 12. FIG. 3 and the following in each case depict a view parallel to the xz-plane. The x-direction runs toward the right in each case, and the z-direction runs upward in each case. Accordingly, the y-direction runs perpendicular to the plane of the drawing into the latter.

Figure 4:
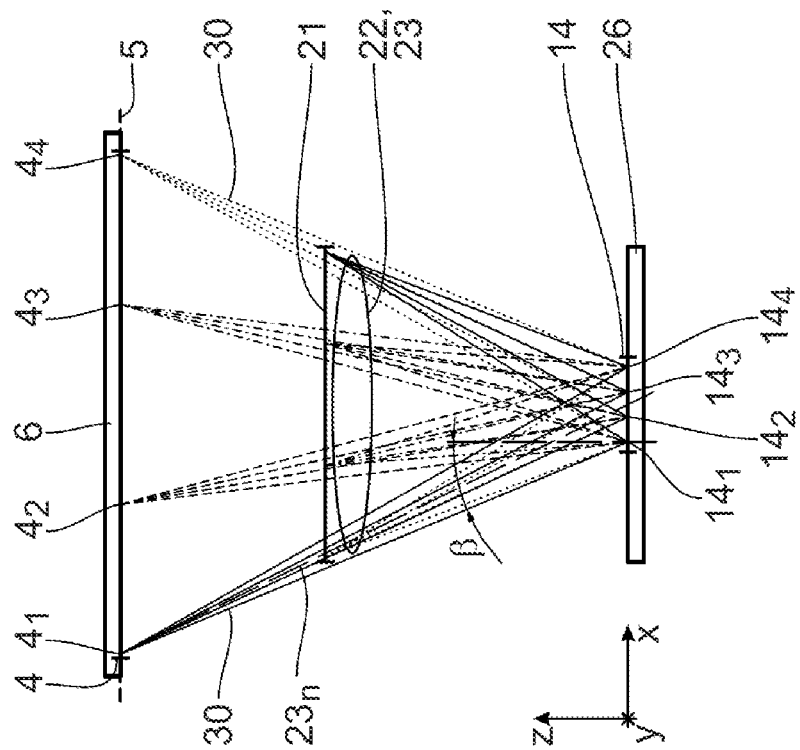
FIG. 4 likewise shows, in an illustration similar to FIG. 3, an illumination beam path from the prior art, wherein in this case the beam path, which belongs to four object field points, is depicted between the field facet and the object field.

In FIGS. 3 and 4, the mirrors 27 to 29 between the pupil facet 26, which is impinged by the illumination light partial beam 23 by way of the field facets 21 and the object field illumination channel 22, and the object field 4 have been omitted.

FIG. 3 shows the beam paths of individual rays 30, which belong to two object field points $4_1$ and $4_4$ with the greatest possible spacing along the x-axis. Four individual rays 30 emanate from each object field point $4_1$, $4_4$.

In the arrangement according to FIGS. 3 and 4 known from the prior art, the pupil facet 26 is arranged at the location of the image 14 of the light source 2, i.e. at the location of the secondary light source.

The four individual rays, which are assigned to the respective object field points $4_1$, $4_4$ are reproduced with a full line, dashed line, dash-dotted line and dotted line, wherein each of the individual rays which go through the same image point $14_1$, $14_2$, $14_3$, $14_4$ of the secondary light source 14 are depicted in the same manner with a full line or a dashed line.

FIG. 4 once again shows the course of the individual rays 30, assigned to the total of four object field points $4_1$, $4_2$, $4_3$ and $4_4$, between the field facet 21 and the object field 4. In FIG. 4, a dashed encoding of the individual rays 30 is such that all individual rays 30, which belong to the same object field point $4_1$ to $4_4$, have the same dashed representation.

From the illustration according to FIG. 3, it becomes ostensibly clear that each one of the object field points $4_n$ receives light from the whole x-extent of the secondary light source 14, i.e. from the whole illuminated region of the pupil facet 26.

From the dashed encoding according to FIG. 4, it becomes clear that each light-source image point $14_n$ guides the illumination light of the illumination light partial beam 23 in the direction of all the object field points $4_n$. An angular bandwidth β of angles of incidence of the illumination light of the illumination light partial beam 23 on the pupil facet 26 is therefore predetermined by the x-extent of the object field 4 on the one hand and by the distance of e.g. the object field 4 from the pupil facet 26 on the other hand in the case of a pupil facet illumination according to the prior art. In the schematic illustration according to FIGS. 3 and 4, an incidence angle bandwidth β of approximately 23° emerges in the case of the pupil facet impingement according to the prior art.

FIGS. 3 and 4 clarify the imaging of the field facets 21 on the object field 4. In FIGS. 3 and 4, the pupil facet 26 is depicted schematically as a plane facet; however, it naturally has a concave shape in reality in order to have the imaging power. To the extent that use is made of a subsequent optical unit, for example with mirrors 27 to 29 (cf. FIG. 2), the pupil facets 26 need not necessarily have an imaging effect since in that case the subsequent optical unit can also bring about the imaging of the field facets 21 into the object field 4.

A beam guidance, according to the disclosure, of the illumination light 12 within an illumination light partial beam 23 between one of the field facets 21 and the object field 4 is depicted on the basis of FIG. 5 and the following. Components which correspond to those already described above in relation to FIGS. 1 to 4, and in particular in relation to FIGS. 3 and 4, are denoted by the same reference signs and are not explained again in detail.

In contrast to the beam guidance according to the prior art, an image 14 of the light source 2, i.e. a secondary light source in the object field illumination channel 22, is only created after reflection at the pupil facet 26. That is to say, a pupil plane 31, in which the secondary light source 14 is arranged, is at a distance from an arrangement plane 32 of the pupil facets 26. The pupil plane 31 coincides with the entry pupil plane of the projection optical unit 8.

If the secondary light source 14, i.e. the image 14 of the light source 2, does not light on the pupil facet 26, but upstream or downstream thereof in the beam path of the respective object field illumination channel 22, the pupil facet 26 has a larger design than what would be involved on account of a dimension of the image 14 of the light source 2. A distance A between the pupil plane 31 and the arrangement plane 32 of the pupil facet 26 is given approximately by a distance B between the arrangement plane 32 and the object plane 5, multiplied by a ratio between an additional diameter of the pupil facet 26 and an extent of the object field 4.

The distance A between the pupil plane 31 and the arrangement plane 32 can be greater than 5% of the distance B between the arrangement plane 32 and the object plane 5. The distance A can be up to 10% greater than the distance B. It is clear that the distances A and B are not pure spatial distances, but instead they are light paths along the beam path of the illumination light 12 or the individual rays 30, and so e.g. folded beam paths of the individual rays 30 are to be represented in an unfolded manner to determine the distance values A and B.

FIG. 6, in which the individual rays 30, which belong to the same object field points $4_1$ to $4_4$, once again have the same dashed appearance as in FIG. 4, makes it clear that a spatial region on the pupil facets 26 in each case no longer reflects the illumination light 12 to all object field points $4_n$. FIG. 6 depicts four spatial regions $26_1$ to $26_4$, which reflect the illumination light 12 of the illumination light partial beam 23 to the four object field points $4_1$ to $4_4$. The respective spatial regions $26_n$ each cover slightly more than a quarter of the whole x-extent of the pupil facets 26 on which illumination light 12 impinges.

At the transition between the spatial regions $26_1$ and $26_2$, individual rays 30 impinge on the pupil facet 26 with angles of incidence in the range between $α_1$ and $α_2$. In the schematic illustration according to FIG. 6, $α_1$ is approximately 18°. $α_2$ is close to the perpendicular incidence. Half an incidence angle bandwidth, which corresponds to the angle of incidence of an individual ray 30 incident centrally within this incidence angle bandwidth, is therefore approximately 9° at the transition between spatial regions $26_1$ and $26_2$ on the pupil facet mirror 26. Hence, the angular bandwidth $α_0$ then is $α_0=½(α_1-α_2)$ and a mean angle of incidence then is $½(α_1+α_2)$. This angular bandwidth is very much smaller than the angular bandwidth β of 23° in accordance with FIG. 4 in the illumination light impingement of the prior art. The mean angle of incidence is approximately 9°.

In the center of an illumination light impingement of the pupil facet 26 according to FIG. 6, i.e. at the transition between the pupil facet regions $26_2$ and $26_3$, the light impinges with an angular bandwidth $α_3$ of approximately 12°, which in turn is very much smaller than the angular bandwidth β from the prior art. Thus, the angle bandwidth $α_0$ in this case is $α_0=α_3$.

An individual ray 30 lying centrally within this angular bandwidth impinges on the pupil facet 26 with perpendicular incidence; i.e., the mean angle of incidence in this case is approximately 0°.

A centroid ray $23_n$ of the individual rays 30, which are respectively assigned to one of the object field points $4_n$, impinges on the pupil facet 26 on a different pupil facet region $26_n$ of the pupil facet 26 depending on the object field point $4_1$.

Expressed differently, each point of the reticle 6 sees a different region of the pupil facet 26 by way of the illumination-light illumination.

Figure 7:
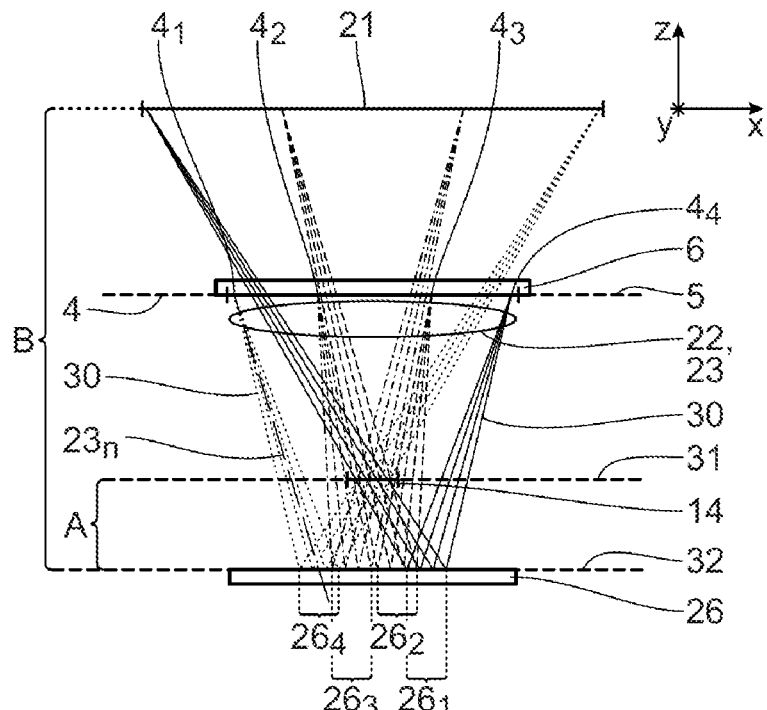
FIG. 7 shows, in an illustration similar to FIG. 6, an illumination light beam path assigned to four object field points in a further arrangement of an illumination optical unit according to the disclosure, with an entry pupil in the beam path between a field facet and a pupil facet.

An overall angular bandwidth of angles of incidence of the centroid rays $23_n$ on the pupil facet mirror 26 is likewise significantly reduced in the beam guidance according to the disclosure in accordance with FIGS. 6 and 7 when compared to the prior art. This becomes clear, particularly in the case of a light source 2 with a small etendue and, correspondingly, a small size of the secondary light source 14, by way of a comparison of the angles of incidence of the edge-side centroid rays $23_n$, which impinge on the center of the pupil facets 26 like all other centroid rays in the case of the illumination according to the prior art, while the edge-side centroid rays $23_n$ impinge on the edge of the pupil facets 26 in the illumination according to the disclosure in accordance with FIGS. 6 and 7.

FIG. 7 shows, in an illustration similar to FIG. 6, a variant of an illumination light guidance according to the disclosure of one of the illumination light partial beams 23 between the object field 4 and one of the field facets 21. The illumination light guidance according to FIG. 7 can be considered to be a reversal of the illumination light guidance according to FIGS. 5 and 6. The secondary light source 14 along the illumination light partial beam 23 is created in the beam path of the illumination light partial beam 23 upstream of the reflection of the pupil facets 26, i.e. in the light path of the illumination light between the field facets 21 and the pupil facets 26. What was already explained above in relation to FIG. 6 once again applies to the distance ratio A/B.

In the illumination light impingement according to FIG. 7, the angular bandwidths at the various pupil facet regions $26_n$ are identical to those according to FIG. 6.

In the case of different distance ratios between the components of the illumination optical unit 3 and the object field 4 and in the case of an actual size of the object field 4, the angular bandwidth $\alpha_0$ is significantly smaller and it can be smaller than 10°, it can be smaller than 7°, it can be smaller than 5°, it can be smaller than 3°, it can be smaller than 2° and it can be even smaller. Accordingly, it is possible to provide a highly reflective coating, in particular a multi-ply coating, exactly matched to the mean angle of incidence, which is more precisely matched to the respective pupil facet region $26_n$. The highly reflective coating, in particular a number of plies of a multi-ply coating, can be matched to the angular bandwidth $\alpha_0$.

Figure 8:
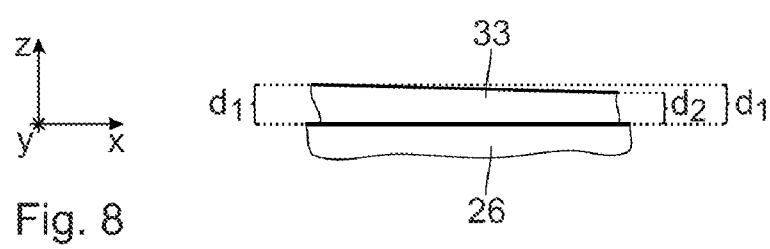
FIGS. 8 to 10 show examples for a spatial dependence of a layer thickness of an individual ply of a multi-ply reflection layer on a pupil facet according to the disclosure.
Figure 10:
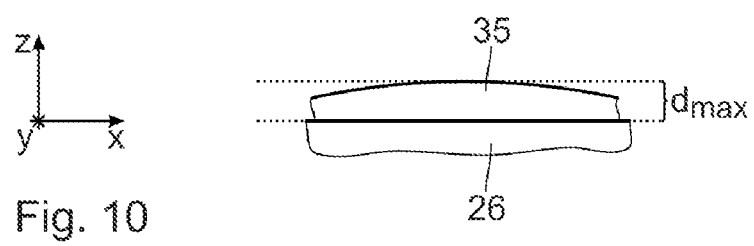

Examples for an extent of a ply of a layer of a highly reflective multi-ply coating on one of the pupil facets 26 are explained on the basis of FIGS. 8 and 10.

FIG. 8 shows a ply of a layer 33, the ply strength d of which, as seen over the x-extent of the pupil facet 26, drops linearly from a larger value $d_1$ to a smaller value $d_2$. Here, this can account for the fact that a mean angle of incidence of the entry rays 30 of the illumination light 12 changes linearly from the left-hand edge of the pupil facet 26 (small x-values) to the right-hand edge of the pupil facet 26 (large x-values).

Figure 9:
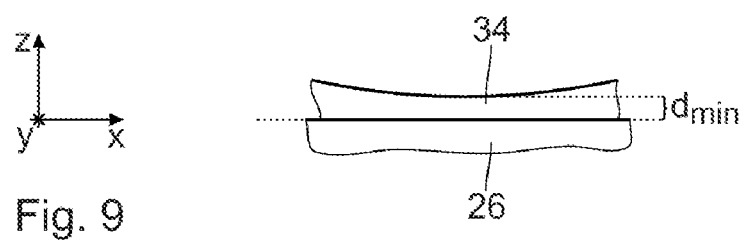

FIG. 9 shows a layer thickness profile of a further embodiment of a ply of a layer 34, the layer thickness d of which assumes a minimum value $d_{min}$ in the center of the pupil facet 26, wherein the layer thickness d increases e.g. parabolically to the outer edge of the pupil facet 26. Thus, FIG. 9 shows a concave layer thickness profile of the ply of a layer 34.

FIG. 10 shows an inverse profile of a layer thickness d of a ply of a layer 35. There, the layer thickness d has a maximum value $d_{max}$ in the center of the pupil facet mirror 26, with the layer thickness d dropping off e.g. parabolically toward the edge of the pupil facet 26. Thus, FIG. 10 shows a convex layer thickness profile of the ply of a layer 35.

The concave or convex layer thickness profile according to FIGS. 9 and 10 takes account of corresponding dependencies of the angles of incidence over the pupil facet regions $26_n$ of the pupil facet 26.

Corresponding dependencies of the thickness d of the layer plies on the y-coordinate of the respective pupil facet 26 are also possible.

A different x- and/or y-dependence of the layer thickness d on the location of the layer ply on the pupil facet mirror 26 may also be present, depending on the profile of a mean angle of incidence over the location on the respective pupil facet 26, i.e. over the pupil facet regions $26_n$.

The other layer plies not depicted in FIGS. 8 to 10 can have corresponding dependencies of the layer thickness d on the x-coordinate.

In respect of the dependence of the layer thickness d on the x- and/or y-coordinate, each one of the pupil facets 26 can have an individually matched layer thickness distribution of the layer plies of the multi-ply coating. Alternatively, it is possible to provide pupil facets 26 with identical multi-ply coatings group-by-group.

The multi-ply coatings with the layer plies 33 to 35 are embodied in such a way that they are matched to the angles of incidence a, which impinge on the respective pupil facet 26 in the respective spatial regions $26_n$. In the case of an impingement according to FIG. 6, the multi-ply coating is therefore matched to an angle of incidence of $\frac{1}{2}(\alpha_1+\alpha_2)$ at the transition of the spatial regions $26_1$ and $26_2$. The multi-ply coating is matched to a mean angle of incidence of 0° at the transition of the spatial regions $26_2$ and $26_3$.

What emerges is a pupil facet mirror 25 with pupil facets 26, which reflect the illumination light 12 with a reflection of greater than 30%. Even higher degrees of reflection are also possible, e.g. reflections greater than 40%, greater than 50% or even greater than 60%.

During the production of a microstructured or nanostructured component, a wafer 9, on which a layer made of a light-sensitive material has been applied at least in part, is initially provided. Moreover, the reticle 6, which has structures to be imaged, is provided. Furthermore, the projection exposure apparatus 1 is provided. Thereupon, an illumination setting is predetermined, i.e. those pupil facets 26 of the pupil facet mirror 25 which are intended to be illuminated are selected, so that a predetermined illumination angle distribution results during the illumination of the object field 4, in which the reticle 6 is arranged. The tilt position of the field facets 21 of the facet mirror 17 is predetermined in accordance with this prescription. Subsequently, at least a part of the reticle 6 is projected onto a region of the light-sensitive layer with the aid of the projection optical unit 8 of the projection exposure apparatus 1.

What is claimed is:

1. An illumination optical unit configured to illuminate an illumination field with EUV illumination light from a light source, the illumination optical unit comprising:

a first facet mirror comprising a plurality of first facets configured for the reflective guidance of partial beams of a beam of the EUV illumination light; and a second facet mirror downstream of the first facet mirror along a path of the EUV illumination light through the illumination optical unit, the second facet mirror comprising a plurality of second facets for the reflective guidance of the partial beams reflected by the first facets so that illumination channels are predetermined by the first facets and the second facets assigned by way of the reflective beam guidance, wherein:

the illumination channels are configured so that the whole object field is illuminable by the illumination light;

for each illumination channel, there is exactly one first facet and exactly one second facet assigned to the illumination channel;

the first facet mirror comprises part of an imaging optical unit configured to generate one of a plurality of images of the light source corresponding to the number of object field illumination channels;

the first facets are imaged into the object field superimposed on one another;

the illumination optical unit is configured so that the second facets are arranged at a distance from the images of the light source along the illumination channels;

illumination optical unit is configured so that, during use of the illumination optical unit, one of the following holds:

all images of the light source lie upstream of the second facets in the beam path of the object field illumination channels; and all images of the light source lie downstream of the second facets in the beam path of the object field illumination channels; and an angular bandwidth of an angle of incidence of the illumination light partial beam on its respective second facet is less than 5°.

2. The illumination optical unit of claim 1, wherein the angular bandwidth of the angle of incidence of the illumination light partial beam on its respective second facet is less than 2°.

3. The illumination optical unit of claim 2, wherein the second facets comprise a highly reflective coating for the EUV illumination light.

4. The illumination optical unit of claim 3, wherein, for at least one of the second facets, the highly reflective coating is matched:

in a first spatial region on the second facet to a maximum reflection of the illumination light incident on the second facet under a first angle of incidence; and in a second spatial region on the second facet to a maximum reflection of the illumination light incident on the second facet under a second angle of incidence, and wherein:
the first spatial region and the second spatial region do not overlap; and
the first angle of incidence differs from the second angle of incidence.

5. The illumination optical unit of claim 4, wherein the illumination optical unit is configured so that, during use of the illumination optical unit, the images of the light source lie between the second facet mirror and the object field along the path of the EUV illumination light through the illumination optical unit.

6. The illumination optical unit of claim 4, wherein the illumination optical unit is configured so that, during use of the illumination optical unit, the images of the light source lie between the first facet mirror and the second facet mirror along the path of the EUV illumination light through the illumination optical unit.

7. The illumination optical unit of claim 1, wherein the second facets comprise a highly reflective coating for the EUV illumination light.

8. The illumination optical unit of claim 7, wherein, for at least one of the second facets, the highly reflective coating is matched:

in a first spatial region on the second facet to a maximum reflection of the illumination light incident on the second facet under a first angle of incidence; and in a second spatial region on the second facet to a maximum reflection of the illumination light incident on the second facet under a second angle of incidence, and wherein:
the first spatial region and the second spatial region do not overlap; and
the first angle of incidence differs from the second angle of incidence.

9. The illumination optical unit of claim 8, wherein the illumination optical unit is configured so that, during use of the illumination optical unit, the images of the light source lie between the second facet mirror and the object field along the path of the EUV illumination light through the illumination optical unit.

10. The illumination optical unit of claim 8, wherein the illumination optical unit is configured so that, during use of the illumination optical unit, the images of the light source lie between the first facet mirror and the second facet mirror along the path of the EUV illumination light through the illumination optical unit.

11. The illumination optical unit of claim 1, wherein the illumination optical unit is configured so that, during use of the illumination optical unit, the images of the light source lie between the second facet mirror and the object field along the path of the EUV illumination light through the illumination optical unit.

12. The illumination optical unit of claim 1, wherein the illumination optical unit is configured so that, during use of the illumination optical unit, the images of the light source lie between the first facet mirror and the second facet mirror along the path of the EUV illumination light through the illumination optical unit.

13. An optical system, comprising:
an illumination optical unit according to claim 1; and
a projection optical unit having an object field arranged in the illumination field of the illumination optical unit, wherein the projection optical unit is configured to image an object in the object field into an image field.

14. The optical system of claim 13, wherein the optical system is configured so that, during use of the optical system, a pupil plane of the projection optical unit coincides with a plane of the images of the light source generated by the imaging optical unit of the illumination optical unit.

15. An illumination system, comprising:
an illumination optical unit according to claim 1; and
the light source.

16. An apparatus, comprising:
an illumination optical unit according to claim 1; and
a projection optical unit having an object field arranged in the illumination field of the illumination optical unit, the projection optical unit is configured to image an object in the object field into an image field; and
the light source,
wherein the apparatus is a projection exposure apparatus.

17. A method of using a projection exposure apparatus comprising an illumination optical unit and a projection optical unit, the method comprising:
using the illumination optical unit according to claim 1 to illuminate at least some structures of a reticle; and
using the projection optical unit to project at least a portion of the illuminated structures of the reticle onto a light sensitive material.

18. The illumination optical unit of claim 1 wherein:
the EUV illumination light has a wavelength of at most 10 nanometer; and
each second facet is configured to reflect its respective illumination light partial beam with a reflection of greater than 30%.

19. The illumination optical unit of claim 1, wherein each second facet is configured to reflect its respective illumination light partial beam with a reflection of greater than 40%.

20. The illumination optical unit of claim 1, wherein each second facet is configured to reflect its respective illumination light partial beam with a reflection of greater than 50%.

* * * * *